(12) United States Patent
Miao et al.

(10) Patent No.: US 11,953,637 B2
(45) Date of Patent: *Apr. 9, 2024

(54) METHODS AND SYSTEMS OF GENERATING SIMULATION GRIDS FOR DIFFERENT STRUCTURAL INTERPRETATIONS

(71) Applicant: ExxonMobil Technology and Engineering Company, Spring, TX (US)

(72) Inventors: Sha Miao, Spring, TX (US); Yifei Xu, Houston, TX (US); Hao Huang, The Woodlands, TX (US); Scarlet A. Castro, Spring, TX (US)

(73) Assignee: ExxonMobil Technology and Engineering Company, Spring, TX (US)

(*) Notice: Subject to any disclaimer, the term of this patent is extended or adjusted under 35 U.S.C. 154(b) by 743 days.

This patent is subject to a terminal disclaimer.

(21) Appl. No.: 17/248,567

(22) Filed: Jan. 29, 2021

(65) Prior Publication Data
US 2021/0149067 A1    May 20, 2021

Related U.S. Application Data

(63) Continuation of application No. 16/389,046, filed on Apr. 19, 2019, now Pat. No. 11,555,937, and a
(Continued)

(51) Int. Cl.
*G06F 30/20* (2020.01)
*G01V 1/28* (2006.01)
(Continued)

(52) U.S. Cl.
CPC .............. *G01V 1/302* (2013.01); *G01V 1/282* (2013.01); *G01V 1/345* (2013.01); *G01V 20/00* (2024.01);
(Continued)

(58) Field of Classification Search
CPC ......... G06F 30/23; G06F 30/20; G06T 17/20; G06T 17/05; G01V 99/005; G01V 1/302; G01V 1/282; G01V 1/345; G01V 20/00
(Continued)

(56) References Cited

U.S. PATENT DOCUMENTS

| 10,038,829 B2 * | 7/2018 | Gilbert ................. H04N 23/661 |
| 10,107,938 B2 | 10/2018 | Huang et al. |

(Continued)

OTHER PUBLICATIONS

Branets et al. (2015) "Capturing Geologic Complexity in a Simulation Grid", SPE-173270-MS, SPE Reservation Simulation Symposium, Houston, Feb. 2015, pp. 1-10.
(Continued)

*Primary Examiner* — Andre Pierre Louis
(74) *Attorney, Agent, or Firm* — ExxonMobil Technology and Engineering Company—Law Department

(57) ABSTRACT

Geologic modeling methods and systems may use design-space to design-space mapping to facilitate simulation grid generation for multiple interpretations of a subsurface region. As one example, one or more embodiments of a geologic modeling method may comprise: obtaining first and second geologic models having different structural interpretations of a subsurface region; mapping each of the geologic models to associated design space models representing an unfaulted subsurface region; determining a design-to-design space mapping from the first design space model to the second design space model; using said mapping to copy parameter values from the first design space model to the second of the design space model; gridding each of the design space models to obtain design space meshes; partitioning cells in the first and second design space meshes along faults; reverse mapping the partitioned design space meshes to the physical space to obtain first and second physical space simulation meshes.

20 Claims, 8 Drawing Sheets

Related U.S. Application Data continuation-in-part of application No. 16/948,718, filed on Sep. 29, 2020, now Pat. No. 11,409,024, which is a continuation-in-part of application No. 16/389,046, filed on Apr. 19, 2019, now Pat. No. 11,555,937.

(60) Provisional application No. 62/705,132, filed on Jun. 12, 2020, provisional application No. 63/006,939, filed on Apr. 8, 2020, provisional application No. 62/952,586, filed on Dec. 23, 2019, provisional application No. 62/752,637, filed on Oct. 30, 2018, provisional application No. 62/752,624, filed on Oct. 30, 2018, provisional application No. 62/688,553, filed on Jun. 22, 2018.

(51) Int. Cl.
*G01V 1/30* (2006.01)
*G01V 1/34* (2006.01)
*G01V 20/00* (2024.01)
*G06T 17/05* (2011.01)
*G06T 17/20* (2006.01)

(52) U.S. Cl.
CPC .............. *G06F 30/20* (2020.01); *G06T 17/05* (2013.01); *G06T 17/20* (2013.01); *G01V 2210/642* (2013.01); *G01V 2210/643* (2013.01)

(58) Field of Classification Search
USPC ...................................... 703/6, 10
See application file for complete search history.

(56) References Cited

U.S. PATENT DOCUMENTS

| 2012/0265510 | A1  | 10/2012 | Lepage |            |
|---|---|---|---|---|
| 2013/0204598 | A1* | 8/2013  | Mallet | G01V 20/00 703/6 |
| 2016/0124117 | A1* | 5/2016  | Huang  | G06T 17/05 703/2 |
| 2016/0125555 | A1* | 5/2016  | Branets | G06T 17/205 705/348 |
| 2017/0184760 | A1* | 6/2017  | Li     | G06F 30/20 |
| 2019/0302309 | A1  | 10/2019 | Li et al. | |

OTHER PUBLICATIONS

Gai, X. et al. (2012) "Concept-Based Geologic Modeling Using Function Form Representation", SPE-161795-PP, pp. 1-13.

Hughes, T. (2000) "The Finite Element Method Linear Static and Dynamic Finite Element Analysis", Part 1., Chapter 2, Sections 2.7-2.10, pp. 75-97. (ISBN-13: 978-0486411811).

* cited by examiner

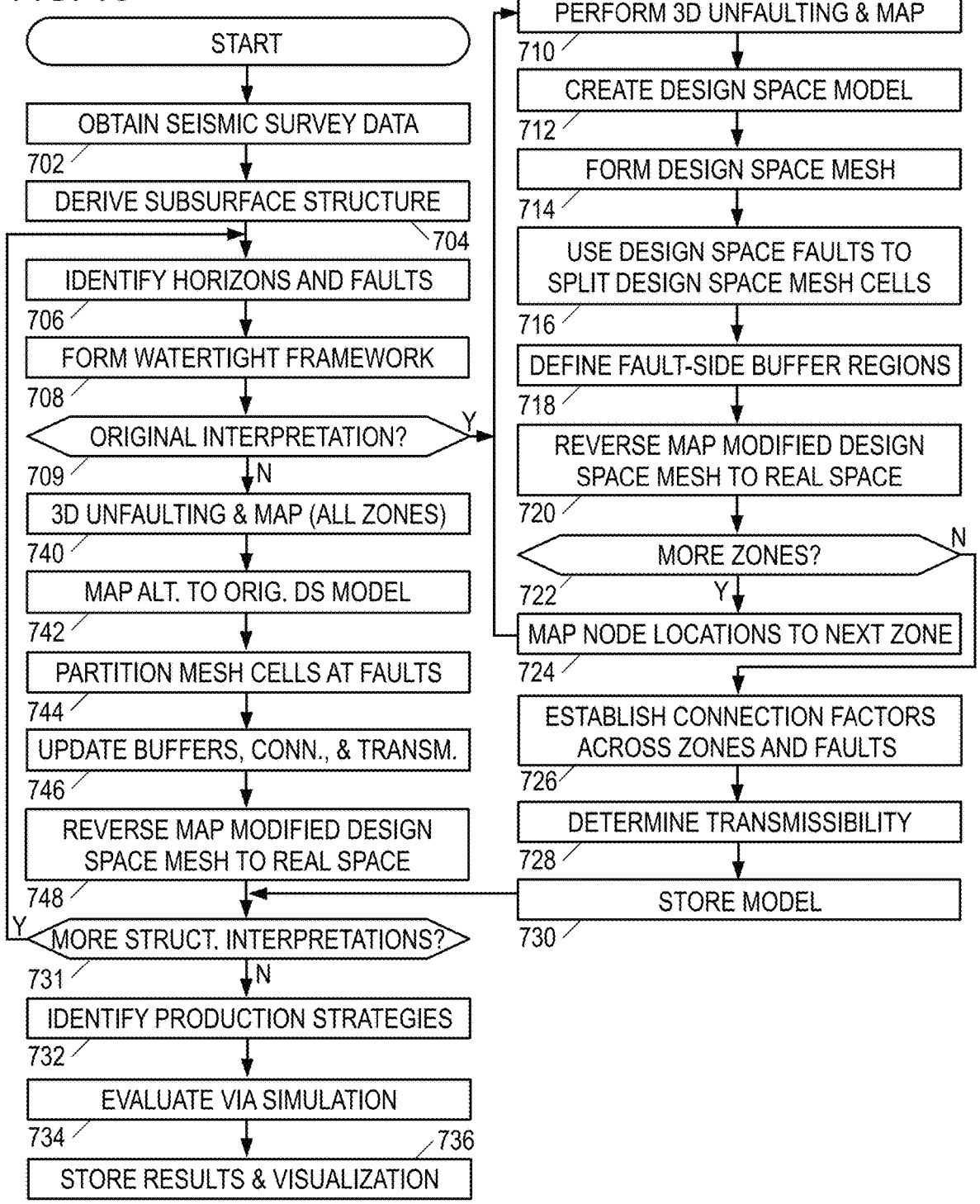

METHODS AND SYSTEMS OF GENERATING SIMULATION GRIDS FOR DIFFERENT STRUCTURAL INTERPRETATIONS

CROSS-REFERENCE TO RELATED APPLICATION(S)

This application claims the benefit of priority of U.S. Patent Application No. 62/705,132, filed Jun. 12, 2020 and U.S. Patent Application No. 63/006,939 filed Apr. 8, 2020, the disclosures of which are incorporated herein by reference.

This application is a continuation-in-part of co-pending U.S. patent application Ser. No. 16/389,046, filed Apr. 19, 2019, which claimed the benefit of priority of (a) U.S. Patent Application No. 62/688,553, filed Jun. 22, 2018, (b) U.S. Patent Application No. 62/752,624, filed Oct. 30, 2018, and (c) U.S. Patent Application No. 62/752,637, filed Oct. 30, 2018, the disclosures of which are incorporated herein by reference.

This application is a continuation-in-part of co-pending U.S. patent application Ser. No. 16/948,718, filed Sep. 29, 2020, which (i) claimed the benefit of priority of U.S. Patent Application No. 62/952,586, filed Dec. 23, 2019, and (ii) is a continuation-in-part of U.S. patent application Ser. No. 16/389,046, filed Apr. 19, 2019, which claimed the benefit of priority of (a) U.S. Patent Application No. 62/688,553, filed Jun. 22, 2018, (b) U.S. Patent Application No. 62/752,624, filed Oct. 30, 2018, and (c) U.S. Patent Application No. 62/752,637, filed Oct. 30, 2018, the disclosures of which are incorporated herein by reference.

TECHNICAL FIELD

The present application relates generally to the field of geologic modeling and reservoir simulation for use in hydrocarbon operations. Specifically, the disclosure relates to methods and systems for generating a volumetric mesh (such as a grid) that may be used for various hydrocarbon operations, such as hydrocarbon exploration, development, and/or production operations. For example, the volumetric mesh may be used in various reservoir simulations for evaluating strategies to develop the reservoir and to extract hydrocarbons from the reservoir.

BACKGROUND

A geologic model is a computer-based three-dimensional ("3D") representation of a region beneath the earth's surface. Such models can be used to model a petroleum reservoir, a depositional basin, or other regions which may have valuable mineral resources. Once the model is constructed, it can be used for various purposes, many of which are intended to facilitate efficient and economical recovery of the valuable resources. For example, the geologic model may be used in various hydrocarbon exploration, development, and production operations. As a more specific example, the geologic model may be used as an input to simulations of petroleum reservoir fluid flows during production operations, which are used to plan well placements and predict hydrocarbon production from a petroleum reservoir over time.

When performing reservoir simulations, geologic models are typically divided into a mesh of volumetric cells, i.e., volumetric elements having material property values that are constant (or otherwise well-defined) within each cell. There is a tradeoff between the number and size of volumetric elements, with more numerous smaller elements typically providing higher accuracies at the cost of higher computational demands. A gridding strategy is considered desirable if it minimizes the computational burden for a given level of accuracy, without requiring an inordinate time to complete the gridding process.

An example of a gridding method is described in U.S. Patent Application Publication No. 2012/0265510 which describes a method to create a grid from a depositional space that includes providing a conformal mesh (which is conformal to geological discontinuities of a geologic model) that includes depositional domain coordinates associated with a depositional domain; providing, in the depositional domain, an initial, at least vertically structured multi-dimensional grid, that includes initial nodes that define grid cells; referencing the conformal mesh to identify a set of grid cells of the initial grid traversed by the geological discontinuities; splitting each of the grid cells in the set to form sub cells; and assigning geological domain coordinates to new nodes to generate a final grid. However, the method in U.S. Patent Application Publication No. 2012/0265510 requires the use of a conformal mesh and a vertically structured grid.

Thus, various gridding strategies are known, but continuing improvements are sought. In particular, it would be desirable to have improved gridding methods that are capable of capturing key geologic features while enabling efficient, yet robust, solution methods.

SUMMARY

Accordingly, there are disclosed herein geologic modeling methods and systems that use design-space to design-space mapping to facilitate simulation grid generation for multiple interpretations of a subsurface region. As one example, one or more embodiments of a geologic modeling method may comprise: obtaining a first and second geologic models representing subsurface regions in physical space, the first and second geologic models having different structural interpretations of one or more features; mapping each of the first and second physical space geologic models to associated first and second design space models representing an unfaulted subsurface region, said mapping employing associated first and second physical-to-design space mappings; determining a design-to-design space mapping from the second design space model to the first design space model; gridding the first design space model to obtain a design space mesh; employing the first physical-to-design space mapping to map a first set of faults from the first physical space geologic model to the design space mesh; employing the second physical-to-design space mapping together with the design-to-design space mapping to map a second set of faults from the second physical space geologic model to the design space mesh; partitioning cells in the design space mesh along the first set of faults to obtain a first partitioned design space mesh; partitioning cells in the design space mesh along the second set of faults to obtain a second partitioned design space mesh; reverse mapping the first and second partitioned design space meshes to physical space to obtain for the first and second geologic models an associated first and second physical space simulation meshes; and outputting the first and second physical space simulation meshes.

The physical space simulation mesh generated pursuant to either method may be suitable for use in one or more hydrocarbon operations, such as hydrocarbon exploration, development, or production operations. For example, the physical space simulation mesh may be suitable for use in in evaluating fluid flow in the subsurface, such as fluid flow during one or more hydrocarbon production operations.

One or more geologic modeling system embodiments described herein may comprise: a memory having geologic modeling software; and one or more processors coupled to the memory to execute the geologic modeling software. The software causes the one or more processors to perform operations that implement at least one of the geologic modeling methods described herein.

One or more illustrative geologic modeling software product embodiments described herein may comprise a non-transitory information storage medium having computer readable program code embodied therein. When executed, the program code configures a computer to implement at least one of the geologic modeling methods described herein.

Each of the foregoing embodiments may be employed individually or conjointly, and by way of examples, one or more such embodiments may optionally employ the following features in any suitable combination: 1. a concatenation of the first physical-to-design space mapping (in reverse) with the second physical-to-design space mapping as said design-to-design space mapping. 2. said design-to-design space mapping is a smooth deformation that aligns corresponding features of the first and second design space models. 3. the first and second geologic models represent different but analogous subsurface regions. 4. the first and second geologic models represent the same subsurface region. 5. the different structural interpretations include different arrangements of faults in the first and second geologic models.

BRIEF DESCRIPTION OF THE DRAWINGS

The advantages of the present invention may be better understood by referring to the following detailed description and the attached drawings. It should be understood that the drawings and corresponding detailed description do not limit the disclosure, but on the contrary, they provide the foundation for understanding all modifications, equivalents, and alternatives falling within the scope of the appended claims.

FIG. 10 is a flow diagram of an illustrative subsurface modeling method.

NOMENCLATURE

Figure 1A:
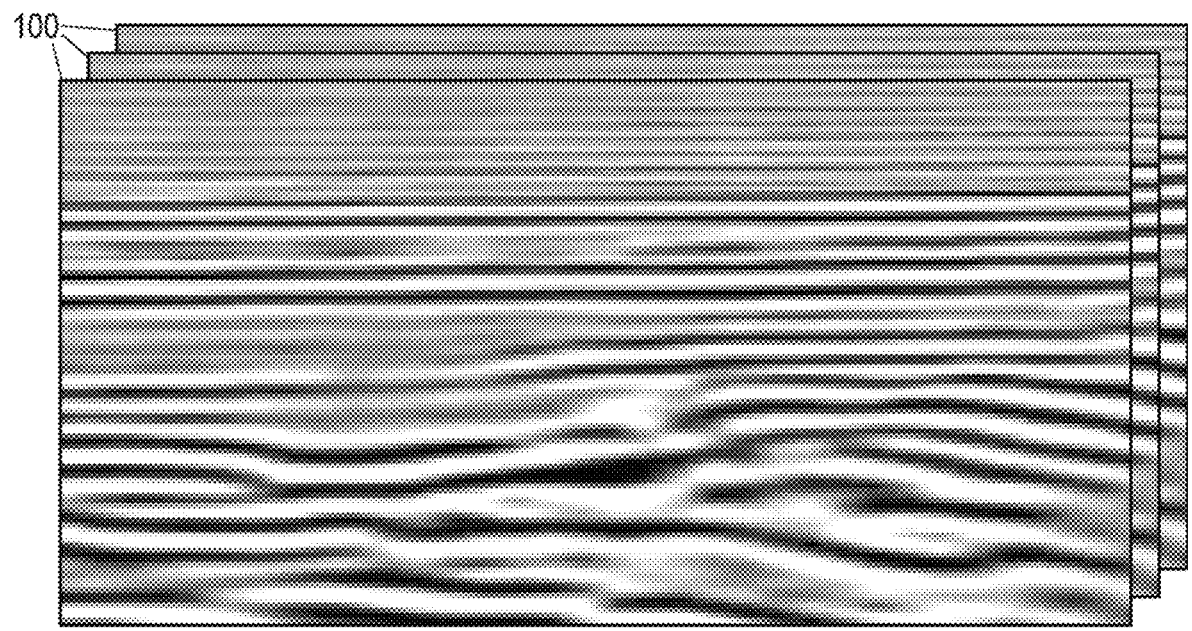
FIG. 1A shows an illustrative measured seismic image volume.

Various terms as used herein are defined herein. To the extent a term used in a claim is not defined herein, it should be given the broadest definition persons in the pertinent art have given that term as reflected in at least one printed publication or issued patent.

As used herein, the term "hydrocarbons" are generally defined as molecules formed primarily of carbon and hydrogen atoms. Hydrocarbons may also include other elements or compounds, such as, but not limited to, halogens, metallic elements, nitrogen, oxygen, sulfur, hydrogen sulfide ($H2S$), and carbon dioxide ($CO2$). Hydrocarbons may be located within or adjacent to mineral matrices within the earth (i.e., reservoirs) such as sedimentary rock, sands, silicilytes, carbonates, diatomites, and other porous media. Hydrocarbons may be produced from hydrocarbon reservoirs through wells penetrating a hydrocarbon-containing formation. Hydrocarbons derived from a hydrocarbon reservoir may include, but are not limited to, petroleum, kerogen, bitumen, pyrobitumen, asphaltenes, tars, oils, natural gas, or combinations thereof.

As used herein, "hydrocarbon exploration" refers to any activity associated with determining the location of hydrocarbons in subsurface regions, especially those activities conducted to acquire measurement data associated with the subsurface regions and to create models based on the data to identify potential locations of hydrocarbon accumulation. The measurement data may include seismic data, gravity data, magnetic data, electromagnetic data, and the like.

As used herein, "hydrocarbon development" refers to any activity associated with planning for hydrocarbon production, especially those activities conducted to analyze and manipulate models to identify preferred strategies and techniques for accessing and/or extracting subsurface hydrocarbons, and based thereon, to formulate plans for production including stages of activity, equipment to be used, and the like.

As used herein, "hydrocarbon production" refers to any activity associated with extracting hydrocarbons from subsurface location, especially those activities conducted to form wellbores, log the wells, complete the wells, service and maintain the wells, treat the formations (e.g., acidization or fracturing to increase flow), mobilize subsurface hydrocarbons (e.g., injection of gas or liquid to increase drive pressure), regardless or whether those activities are associated with primary, secondary, or tertiary production.

As used herein, "hydrocarbon operations" refers to any activity associated with hydrocarbon exploration, hydrocarbon development, and/or hydrocarbon production.

As used herein, "surfaces" refer to geologic features, such as horizons and faults, as well as technical features, such as model boundaries, concession boundaries, or arbitrarily defined subregion boundaries. Horizons separate different regions of rock, often along an interface between rocks of different age or type. A fault is a discontinuity within a rock region, which may be associated with a displacement of the rock on one side of the fault from its original position relative to the rock on the other side of the fault.

As used herein, "structural framework" or "framework" refer to a subsurface representation formed from representations (e.g., polyline or mesh representations) of surfaces. A framework may be formed by surfaces of geologic, engineering, planning or other technical relevance.

As used herein, "subsurface model" refers to a reservoir model, geomechanical model, watertight model, and/or a geologic model. The subsurface model may include subsurface data distributed within the model in two dimensions, three dimensions, or four or more dimensions.

As used herein, "watertight" means that the one or more surfaces defining the relevant subregion(s) of a model have no holes and no overlaps with other surfaces bounding that subregion. A watertight framework of faults and horizons is one that fully divides a specified region of interest into watertight subregions such that any path from one subregion to another must cross a surface. As a consequence, each fault and horizon in the framework either exists as a subregion boundary, or is fully contained within a subregion.

As used herein, "watertight model" is a model of the subsurface region having one or more watertight subregions.

As used herein, "geologic model" is a model of the subsurface region having subregions with associated static properties (such as facies, lithology, porosity, permeability, or the proportion of sand and shale). The subregions may be defined by surfaces and/or a mesh that divides the subsurface region into polygonal cells (of two, three, or more dimensions).

As used herein, "reservoir model" is a geologic model that also associates with each subregion one or more dynamic properties that vary over the timescale of resource extraction, such as fluid composition, pressure, and relative permeability.

As used herein, "geomechanical model" is a geologic model having static properties suitable for modeling the mechanical response of the rocks in the subsurface region, such as rock compressibility and Poisson's ratio. Geomechanical models are useful for measuring effects such as compaction, subsidence, surface heaving, faulting, and seismic events, which may result from, e.g., fluid injection and extraction.

As used herein, "mesh" or "grid" is a representation of a region of space (e.g., 2-D domain or 3-D domain), using nodes and edges that define a set of polygons or polyhedra disposed within the region. The mesh may also conform to, or define, surfaces within the region. Properties may be assigned to some or all polygons. Though the terms "mesh" and "grid" may be used interchangeably, when they are employed together the term "mesh" is used to indicate a finer (more sub-divided) representation and "grid" is used to indicate a coarser (less-subdivided) representation.

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve executing a reservoir-simulator computer program on a processor to compute composition, pressure, or movement of fluid as function of time and space for a specified scenario of injection and production wells by solving a set of reservoir fluid flow equations. A geomechanical simulation may involve executing a geomechanical simulator computer program on a processor to compute displacement, strain, stress, shear slip, or energy release of the rock as a function of time and space in response to fluid extraction and injection.

DETAILED DESCRIPTION

Various specific embodiments, versions, and examples of the invention will now be described, including preferred embodiments and definitions that are adopted herein for purposes of understanding the claimed invention. While the following detailed description gives specific preferred embodiments, those skilled in the art will appreciate that these embodiments are exemplary only, and that the invention can be practiced in other ways. For purposes of determining infringement, the scope of the invention is determined by one or more of the appended claims, including those variations and modifications of the recited limitations that are equivalent to the ones that are recited. Any reference to the "invention" may refer to one or more, but not necessarily all, of the inventions defined by the claims.

FIG. 1A shows an illustrative measured seismic image volume 100, which can be expressed in many ways but is here shown as parallel slices of a three-dimensional volume. The measured image volume 100 is typically obtained by processing field-recorded seismic survey traces representing seismic wave responses to shots or other sources of seismic energy that have been triggered at an array of shot locations. The processing corrects for seismic wave travel times to determine locations of reflective interfaces, and combines repeated measurements at each location to increase the signal to noise ratio. While seismic reflectivity is commonly employed, other seismic wave properties can also or alternatively be derived from the traces and used to construct the measured seismic image volume. One particular transformation of interest is the inversion of the seismic data to estimate petrophysical parameters such as porosity, clay volume fraction, etc. that are often part the geological model.

Figure 1B:
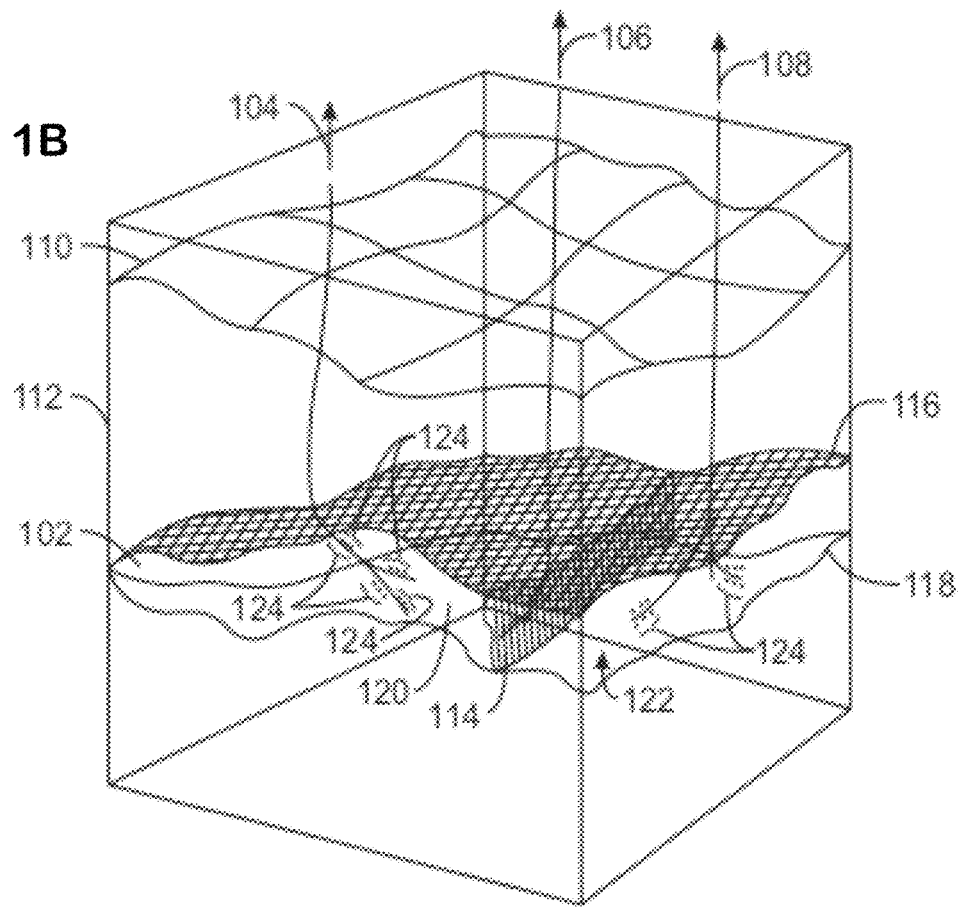
FIG. 1B shows an illustrative "watertight" subsurface model.

FIG. 1B shows an illustrative subsurface model having features that may be derived from a seismic image volume. The illustrative model includes a number of surfaces defining the boundaries of a potentially hydrocarbon-bearing formation 102 that may serve as a reservoir of oil or natural gas. The model facilitates planning well placements and drilling the wells (e.g., wells 104, 106, 108), from the Earth's surface 110 through layers of overburden 112 to access the formation 102. The illustrative model surfaces may include faults 114 and horizons 116, 118. The surfaces may intersect in a fashion that divides the reservoir formation 102 into distinct compartments 120, 122. The petrophysical parameters of each compartment may be estimated based on the seismic image data, measured using logging instruments in exploratory wells, and/or determined by other methods known in the art.

Modern drilling techniques enable the wells 104, 106, 108 to deviate from the vertical orientation and to be directionally drilled to follow the reservoir 102. Further, the wells can be branched to increase the amount of wellbore contact with the reservoir, as shown for wells 104 and 108. The wells 104, 106, and 108, can have numerous areas with perforations 124 (indicated as dots next to the wells) to provide a flow path for fluids, such as hydrocarbons, from the reservoir 102 into the wells 104, 106, and 108 for removal to the surface. If properly employed, such steering and completion techniques may enable faster and more efficient extraction of reservoir fluids.

The locations and paths for the wells 104, 106, and 108, and the location of the perforations 124, may be optimized by performing reservoir fluid flow simulations based on the subsurface model. Subsurface models are often used as inputs to reservoir simulation programs that predict the behavior of fluids contained therein and may also predict the behavior of the formation rocks under various scenarios of hydrocarbon recovery. Miscalculations or mistakes can be costly. For example, miscalculations may result in suboptimal locations for the wells 104, 106, and 108, inhibiting access to the fluids in the reservoir formation. Subsurface model-based planning and simulation provide a mechanism to identify which recovery options offer more economic, efficient, and desirable development plans for a particular reservoir.

More specifically, subsurface model construction begins with extraction of surfaces from a seismic image region, including faults, horizons, and defining any additional surfaces such as boundaries for the region of interest. The different surfaces may be adjusted and trimmed to define closed "watertight" subregions often called zones, compartments, or containers, such as zones 120 and 122. "Watertight" here refers to the absence of gaps where boundary surfaces intersect, and such models are readily achieved if the surfaces are represented using continuous functions, which are able to be shifted, extended, and/or trimmed. Such representations facilitate the moving or refining the surfaces to, e.g., test alternatives for resolving interpretation ambiguities. This ability to move and refine surfaces may lead to higher production by impacting the desired positioning of the wells 104, 106, and 108 or the perforations 124.

While beneficial for many purposes, the surface-based representation does not function well for numerical simulation of reservoir fluid flows. For such simulations, it is preferred to have the model gridded into a mesh in which each cell has homogenous (or otherwise well-defined) material properties and potentially has a defined connectivity or fluid transmissibility to each adjacent cell (each cell with which it shares a cell boundary). An illustrative method for obtaining a simulation mesh is now described with reference to FIGS. 2A-2I, which for purposes of illustration are two-dimensional, vertical cross-sections of a three-dimensional subsurface model.

Figure 2A:
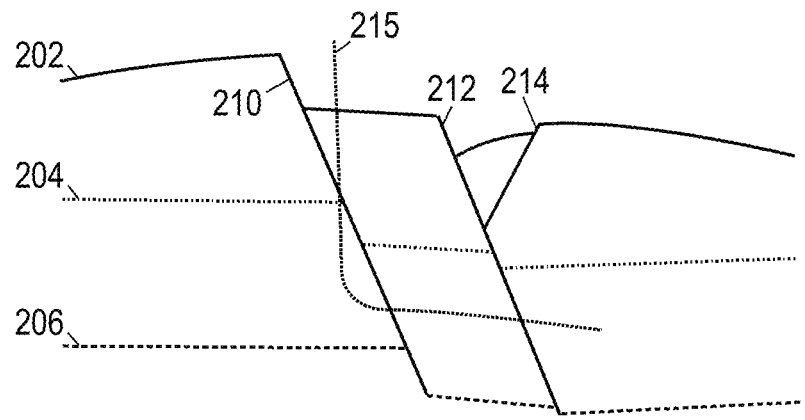
FIG. 2A is a cross-section of an illustrative physical-space model.

FIG. 2A is a subsurface model in which three horizons 202, 204, 206, three faults 210, 212, 214, and a borehole 215 are shown. In accordance with the foregoing description, the horizons and faults may be represented by continuous functions that intersect to form a watertight model. Alternatively, the surfaces may be represented by surface meshes. In any case, the modeled volume is a useful representation of the physical substructure but may not be the most convenient representation for engineers to work with. Though a simple example is presented here, faulted models tend to unduly multiply the number of disconnected geobodies such that it becomes difficult and tedious to analyze material properties.

Figure 2B:
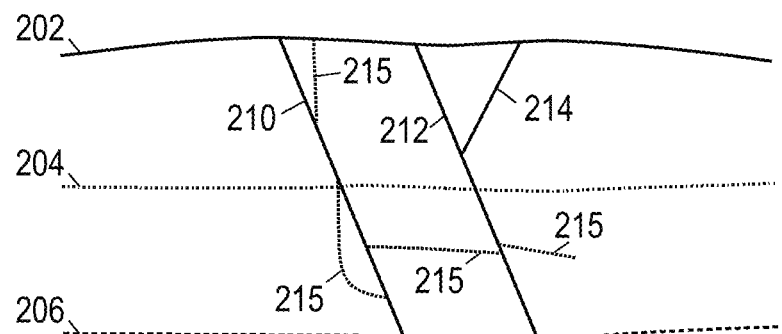
FIG. 2B is a cross-section of an illustrative "unfaulted" subsurface model.

One approach to this issue is to displace and deform the subregions to create a continuous "unfaulted" subsurface model as shown in FIG. 2B. An example of such a transformation process is described in U.S. Pat. No. 10,107,938, titled "Managing Discontinuities in Geologic Models", the disclosure of which is incorporated herein by reference. However, because the process to create a map has a complexity order $O(N^3)$, where N is the number of nodes in the region of interest around the faults, the computational burden may become unduly large. It may be preferred to approach the region of interest in a zone-by-zone fashion, first performing the un-faulting operation for a first zone (e.g., the subregion between surfaces 204 and 206), then performing the operation separately for a second zone (e.g., the subregion between surfaces 202 and 204). Each halving of the number of nodes reduces the computational burden by a factor of about $2^3$.

Figure 2C:
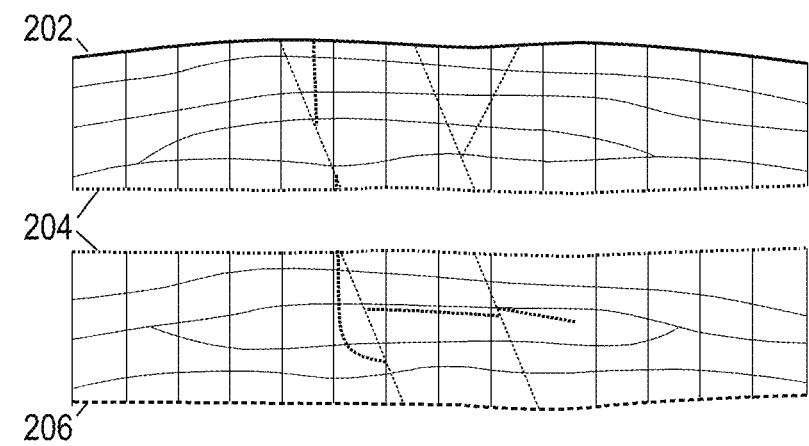
FIG. 2C is a cross-section of an illustrative gridded multi-zone design-space model.

Accordingly, the "real space" or "physical space" representation shown in FIG. 2A may be transformed into a multi-zone "design space" representation (sometimes referred to as a "depositional space" representation) such as that shown in FIG. 2C. Thus, the transformation process seeks to "heal" any faults or other discontinuities in each given zone, thereby restoring all geobodies from their current faulted state and segmented state to a continuous (un-faulted) unified state. As before, the process described in U.S. Pat. No. 10,107,938 may be employed to determine the mapping from physical space to the design space in each zone. "Mapping" refers to a function that associates an input position in physical space with an output position in design space. The function may be explicitly expressed as a mathematical formulation, or as another example, it may be based on a geometric discretization of space in which a mapping function is defined on a cell by cell basis. In the latter case, a point is mapped by first determining which mapping cell it belongs to and then applying a simple mathematical function in that cell. The real-space to design-space mapping is preferably derived and applied in a manner that minimizes deformation and preserves in the design space the resemblance to the physical space.

Thus, horizon 202 is been converted from its faulted form in FIG. 2A to a continuous surface in FIG. 2C. Horizon 204, which for the purposes of the present example is an erosion-created surface, defines both the bottom of the upper formation bed and the top of the lower formation bed. In any case, the faults in horizon 204 and the lowermost horizon are also corrected, thereby creating continuous, unfaulted formation beds. Note that as part of the mapping process, the system may numerically analyze and re-align smaller-scale structures on opposing faces of each fault.

The design space facilitates further work by the scientists and engineers to analyze small scale features, identify boundaries of additional geobodies, and determine suitable values for the material properties of each geobody. These additional geobody boundaries are also represented in FIG. 2C. Also shown is a simulation grid derived for the design space model, spanning the entire region of interest. Various gridding methods are available in the open literature including, e.g., Branets et al., "Capturing Geologic Complexity in a Simulation Grid", SPE-173270-MS, SPE Reservation Simulation Symposium, Houston, February 2015, the disclosure of which is incorporated herein by reference. The illustrated grid is derived by vertically extruding vertices of an areal grid (e.g., a Cartesian grid in the X-Y plane) on the bottom horizon of each zone and finding intersections of the vertical extrusions with the surfaces representing the geobody boundaries, thereby generating a 3D grid that honors the geobody boundaries. Additionally, the areal grid may be refined (i.e., given a finer resolution) near any existing or proposed well trajectories mapped from the real space. Where the grid cells are deemed to be too large, they may be subdivided with the introduction of new nodes where needed. If desired, each grid cell may in turn be sub-gridded to define a volumetric mesh within each subregion of the cell.

Figure 2D:
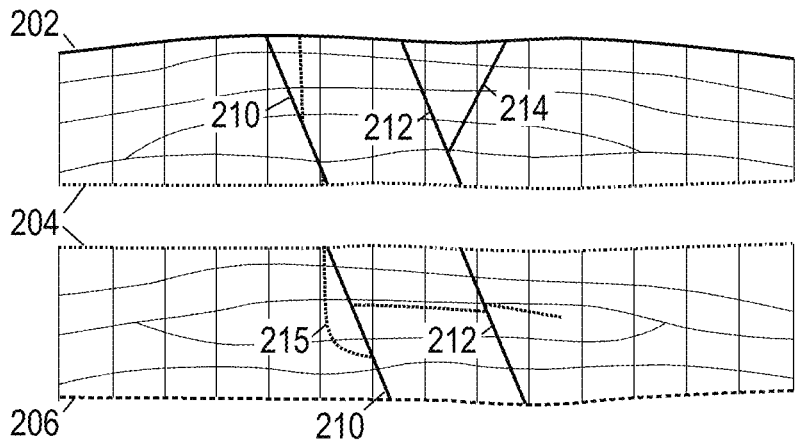
FIG. 2D is a cross-section of an illustrative partitioned design-space model.

The faults are represented in FIG. 2C as dashed lines for easy reference, but the introduction of those faults into the design space is a separate operation as represented in FIG. 2D. For FIG. 2D, a real-space to design-space mapping is applied to the faults 210, 212, 214 to determine the fault locations in the design space. The fault surfaces are applied to the simulation mesh to partition the mesh cells that they intersect. The partitioning process enables an offset to be introduced between the fault faces during the remapping back to physical space. The offset may vary across the fault surface.

Before proceeding further with the process for obtaining a simulation mesh, we turn momentarily to FIGS. 3A-3E for a discussion of the partitioning process and the definition of fault-sided buffer regions.

Figure 3A:
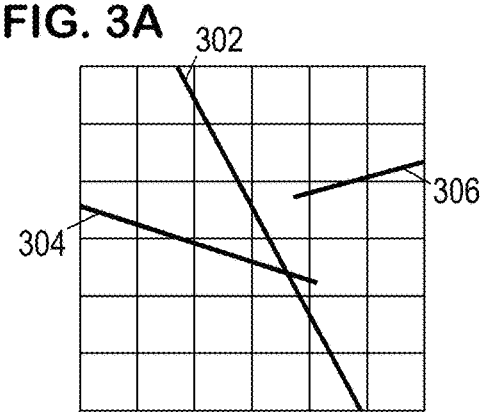
FIG. 3A is a cross-section of an illustrative model having multiple faults.

As the mapping from physical space to design space varies from cell to cell, it is perhaps expected that in mapping the faults (and other surfaces) to design space, the faults in design space may not be watertight with respect to their major faults or horizons. As an illustrative example, FIG. 3A shows a primary fault 302, a secondary fault 304 that overlaps the primary fault 302, and a secondary fault 306 that falls short of the primary fault. To correct this issue, the faults (and other surfaces) are organized in an ordered fashion (e.g., primary fault, secondary fault) or, alternatively each pair of intersecting faults may be related as a truncation pair ("truncation relationship pair") specifying which fault truncates the other. The faults lower in the hierarchical order or lower in the truncation relationship are to be fully contained by faults or surfaces higher in the hierarchy or relationship. The faults are taken in order and applied to subdivide any grid or mesh cells that contain them so that the faults are fully represented by cell faces. The grid cells are fully split if they contain no other faults (or more specifically, no intersections with any faults) from higher in the hierarchy. If the grid cells do contain an intersection of the current fault with a fault from higher in the hierarchy, only the subcell on the appropriate side of that fault is split by the current fault.

Figure 3B:
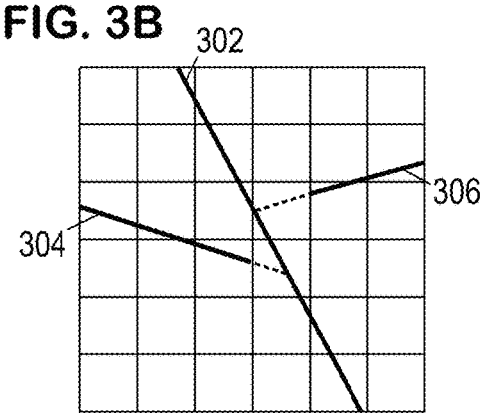
FIG. 3B is a cross-section of an illustrative model having an intersecting fault hierarchy.
Figure 3C:
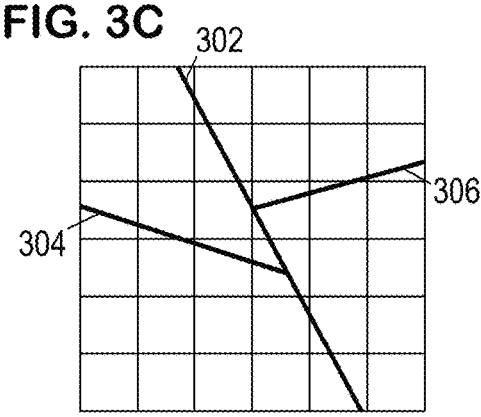
FIG. 3C is a cross-section of an illustrative model having cells partitioned by fault intersections.

FIG. 3B shows the partitioning of grid cells by primary fault 302, and by secondary faults 304, 306 where indicated by solid lines. The dotted portions of these faults are shown in the cells containing an intersection with the primary fault 302. If the secondary fault doesn't reach the intersection with the primary fault (e.g., fault 306), it may be extended using any one of many available techniques. In one illustrative embodiment where the faults are represented by triangulated surfaces, the extension can be achieved by excluding boundary edges from the trim distance calculation where extension needs to be made. As a result, the fault surface may be considered as infinitely extended beyond the missing boundary edges, such that it is only terminated by major faults or horizons where the watertight intersection is sought. FIG. 3C shows the result including the watertight intersections.

Figure 3D:
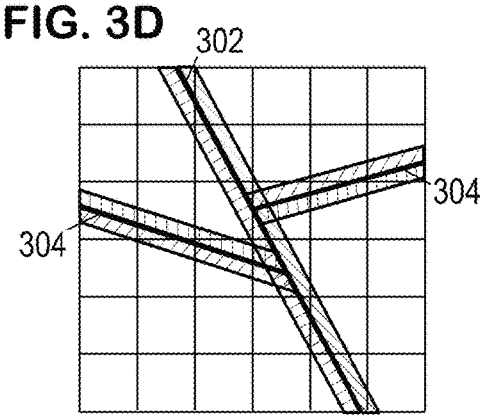
FIG. 3D is a cross-section of an illustrative model having fault-sided buffer regions.
Figure 3E:
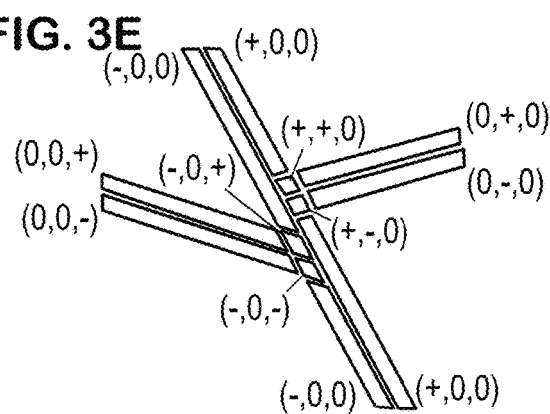
FIG. 3E is an exploded diagram of the fault-sided buffer regions.

Once a watertight framework is established, a set of fault-sided buffer regions may be established. For each given side of a fault, a region is defined. Various definition techniques may be employed, such as, e.g., including all mapping grid cells having a face on the fault, or including all simulation grid cells within a predetermined distance of the fault. Significantly, each region includes only grid cells on the given side of the fault, and excludes any grid cells from the other side of the fault. FIG. 3D shows a cross-hatched region for each side of each fault. Where the regions intersect, their intersection is treated as a separate region. For clarity, FIG. 3E shows an exploded view of the fault-sided buffer regions, with labels. In FIG. 3E, each region is labeled with a vector having three elements corresponding to the three faults. Each element has either a positive value ("+") (to indicate a first side of the corresponding fault), a negative value ("−") (to indicate the other side of the corresponding fault), or a zero value to indicate no proximity to the corresponding fault. Thus, for example, the regions labeled with (+,0,0) indicate grid cells on a first side of the first fault but not close to the second or third faults. Those cells not proximate to any fault may be considered to be in the (0,0,0) background region (not specifically labeled in the figures).

At some point during or after the gridding and partitioning process that leads to the situation depicted in FIG. 2D, petrophysical parameter values are assigned to each mesh cell and/or cell surface. Illustrative parameter values include transmissibility or flow rates between cells, rock type, porosity, permeability, oil saturation, groundwater saturation, gas saturation, clay content, and cementation. The assignment process is expected to be based on the geobody properties determined by scientists and engineers through their analysis of horizons, small scale features, and other geologic structures, but may also employ spatially correlated reservoir properties and/or fluid properties as derived from wellbore measurements, rock type probability maps, and geostatistical distributions. Geostatistics may be used in subsurface models to interpolate observed data and to superimpose an expected degree of variability. Kriging is a suitable geostatistic technique, which uses the spatial correlation among data to construct the interpolation via semivariograms. Repeated interpolations with different variograms, different seeds, different training images, etc., may be performed to assess spatial uncertainties and determine a degree of confidence in the proposed interpretations.

Another approach that may be used to determine parameter values for the design space geobodies and mesh cells is Function Form Modeling ("FFM"). The details of this approach are available in the open literature including, e.g., Xiuli Gai et al., "Concept-based geologic modeling using function form representation", SPE 161795-PP, 2012, the disclosure of which is incorporated herein by reference.

Figure 2E:
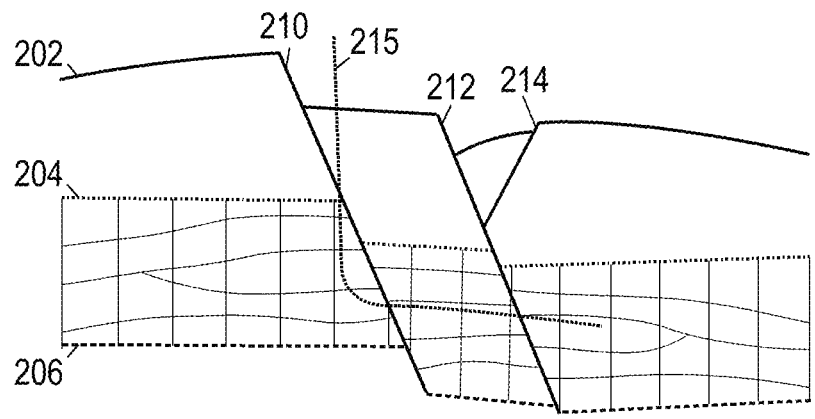
FIG. 2E is a cross-section of an illustrative physical-space model with a simulation mesh in a first zone.
Figure 2F:
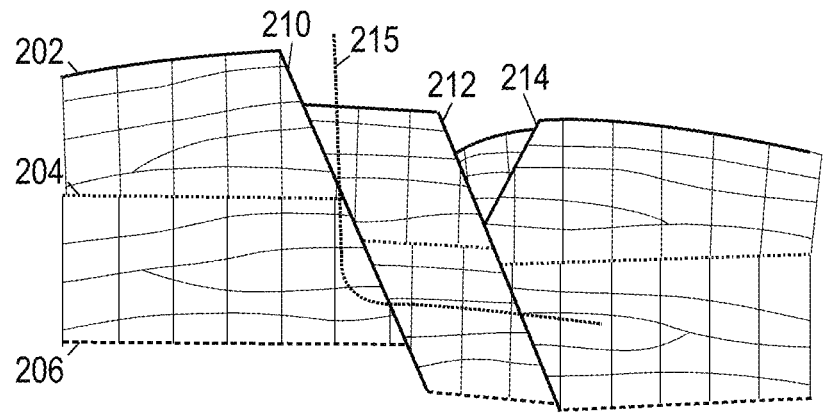
FIG. 2F is a cross-section of an illustrative physical-space model having a simulation mesh with misalignments at zone transitions.

From the multi-zone design space model represented by FIG. 2D, the derived mapping is applied in reverse ("reverse-mapping") to translate the design-space mesh into a real-space simulation mesh. As shown in FIGS. 2E and 2F, the reverse mapping process may be performed zone by zone in a directional fashion, e.g., bottom-up or top-down. It is the bottom-up process that is shown here, but the principles are equally applicable to a top-down process (or even to a center-outwards process).

The gridding and meshing of the design space are done using nodes to define grid and mesh cells, and when cells are partitioned into subcells by faults, additional nodes are created to define the subcells. These additional nodes lie on the fault surface and hence are at a potential discontinuity in the mapping function. The process for mapping a point from design-space to physical-space first determines which cell contains the point and then applies the reverse mapping function for that cell. Nodes at or near a mapping function discontinuity are vulnerable to numerical errors that may cause the node to be contained by a cell on the wrong side of a fault and thereby be subjected to an improper reverse mapping function causing significant distortions in the simulation mesh.

Each fault may be given a unique identification number or name, and the sides of each fault are assigned different identifiers (e.g., "+" and "−"). When the subcells are created, the additional nodes are positioned on a known side of the given fault. Thus, it is possible to restrict the search scope when searching for the appropriate grid cell to determine the proper reverse mapping function. In at least some embodiments, the scope is limited by excluding from the search any cells in the fault-sided buffer regions for the wrong side of the fault. Thus, with reference to FIGS. 3D-3E, a mapping function search for a node on the positive side of fault 302 would exclude the (−,x,x) buffer regions (where x is a wildcard that matches "−","+", and "0").

Returning to FIGS. 2E and 2F, the mapping between the design and real space is preferably done zone by zone for speediness of map generation and the convenience of property assignment in the design space. However, this practice may lead to discontinuous meshing across interfaces between zones. FIG. 2F shows the simulation grid that may result from applying independent zone mapping from FIG. 2D to the physical space. (The mesh discontinuities across horizon 204 are most evident in the center region of FIG. 2F.) The grid discontinuity may decrease flow simulation accuracy.

Figure 2G:
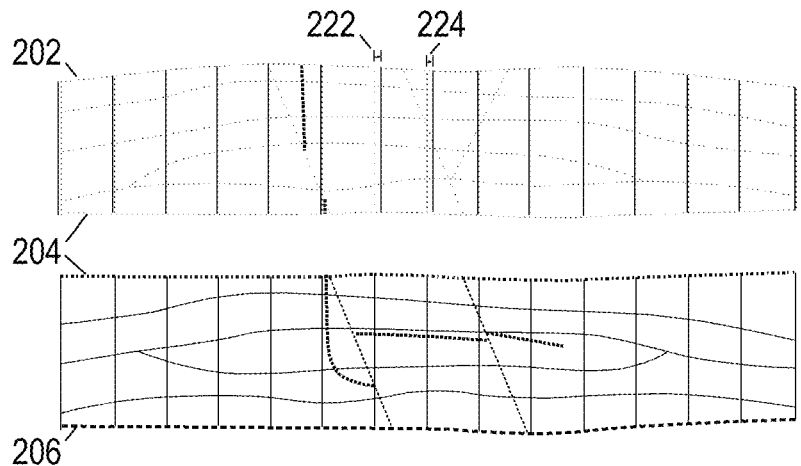
FIG. 2G is a cross-section of an illustrative multi-zone design space model with grid re-alignment.
Figure 2H:
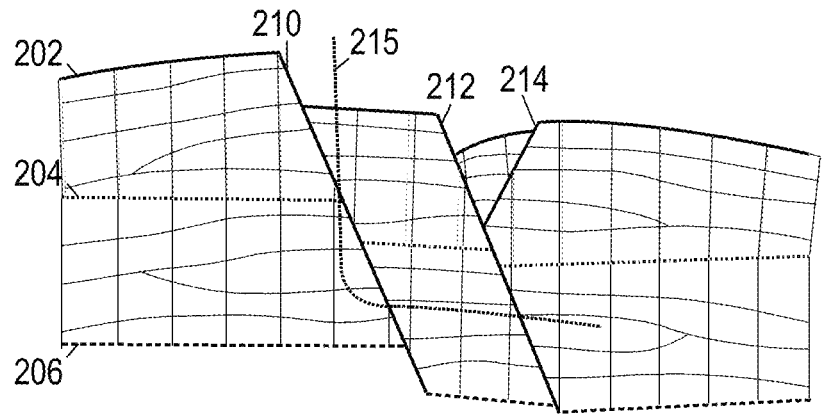
FIG. 2H is a cross-section of an illustrative physical-space model having an aligned simulation mesh.

To establish a continuous grid across zone interfaces, the physical space grid node locations on the top surface of the preceding zone are mapped to the bottom surface of the current zone in design space to serve as the initial node locations for defining the design space grid for the current zone. Accordingly, as shown in FIG. 2G (where the initial node locations are vertically extruded from the bottom horizon of each zone to find intersections with the surfaces representing the geobody boundaries), the initial node locations are shifted relative to the "naïve" gridding approach used in FIG. 2C. The shifts 222 and 224 in the center region are the most visible in FIG. 2G. When the shifted grid in this second design space zone is mapped to the second physical space zone as shown in FIG. 2H, the grids become aligned across the horizon 204. This process may be repeated for each subsequent zone, such that the initial node locations for the ith zone in design space are based on the top surface node locations of the (i−1)th zone ("connected zone") in physical space, if any such zone is present.

Figure 4:
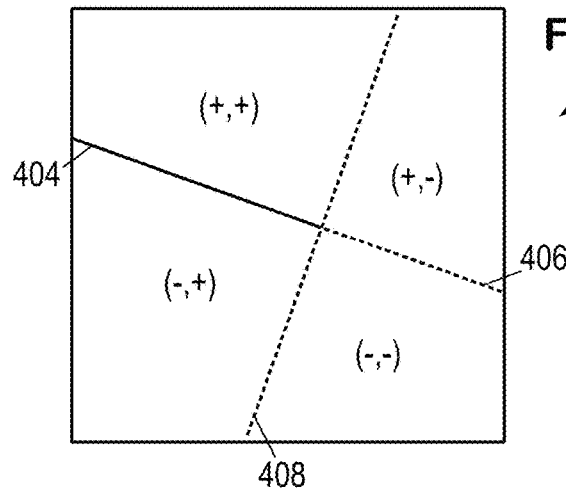
FIG. 4 is a plan view of a partially faulted horizon.

Grid cells that are adjacent to zone interfaces and cut by faults are paired by matching their bounding fault IDs and sideness. FIG. 4 shows a plan view of a grid cell face 402 on an interface surface between zones. A fault 404 is shown partially cutting across the cell face, with a pseudo-extension surface 406 that extends the fault to complete the division of the cell and a trim surface 408 intersecting the fault termination at an angle substantially perpendicular to the fault 404. The resulting subcells are labeled based on which side of the fault 404/extension 406 and which side of the trim surface 408 they are on. The (+,+) region indicates the positive side of the fault and the trim surface, the (+,−) region indicates the positive side of the fault and negative side of the trim surface, etc. When establishing connectivity across the zone interface in physical space, the (+,+) subcell face on the top surface of the preceding zone is matched to the corresponding subcell face on the bottom surface of the current zone, and so on.

Figure 2I:
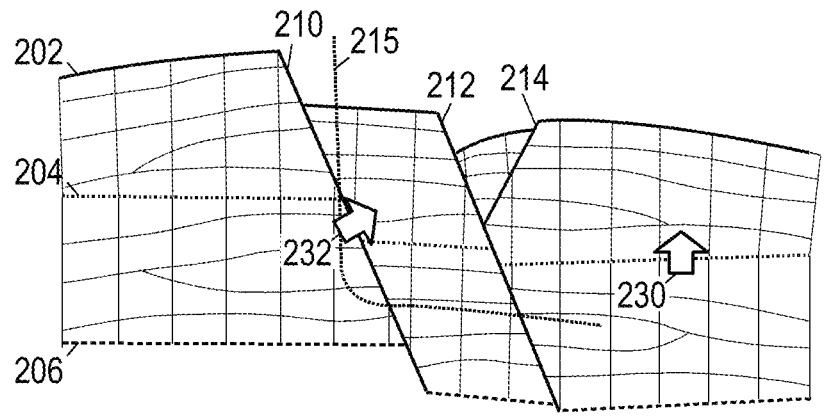
FIG. 2I is a cross-section of an illustrative physical-space model with cross-fault and cross-horizon connections between zones.

Once each of the zones in physical space have been gridded, the reservoir connectivity needs to be constructed in and between the zones. Connections between the cells that share the same faces can be automatically identified and the transmissibility of fluid across the shared face can be automatically computed. The use of a continuous grid and the fault-subcell face-matching technique described herein facilitates this process as applied across zone interfaces. This connection determination process is represented in FIG. 2I by arrow 230. For cells not cut by faults, the face matching is provided automatically by the continuity of the grid across the interface. For cells on the zone interface cut by faults, the subcells sharing the same fault and trim surface sides are matched and the appropriate connection transmissibility calculated.

Figure 5:
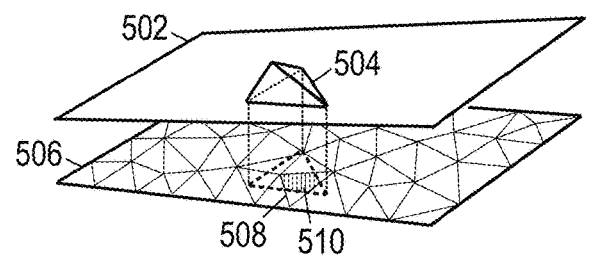
FIG. 5 is a perspective view of a cell face projected across a fault.

Thereafter, fault-crossing connections between zones (as indicated by arrow 232) may be determined. It is expected that the faces on opposite sides of the fault will not match due to displacement in the physical space. Accordingly, an overlap calculation may be performed between each pair of cell faces having opposite sideness. FIG. 5 shows a first fault surface 502 partially defined by one face 504 of a tetrahedral mesh cell. A second fault surface 506 is shown with an exaggerated separation from the first fault surface 502 for illustrative purposes. Fault surfaces 502 and 506 represent the positive and negative sides of a fault.

Fault surface 506 is shown as being tiled by cell faces including cell face 508, each of which has an opposite sideness from the cell face 504. Each positive side face (e.g., 504) is projected onto each negative side face (e.g., 508), and a polygon intersection calculation performed to determine the overlapping area 510 after the fault displacement. Overlapping area 510 is used as the flow area in the connection factor calculation for determining transmissibility between the corresponding cells. Each cell may have fluid flow connectivity with multiple cells on the opposite side of the fault. This determination overlapping areas between cell faces on opposite sides of a fault in real space is referred to herein as "face splitting".

We pause here to note the face-projection approach can also be applied across zone interfaces if it is deemed unnecessary to employ the grid-alignment process described previously. As with the cross-fault transmissivities, the cross-horizon transmissivities can be set in proportion to the overlapping areas.

Figure 6:
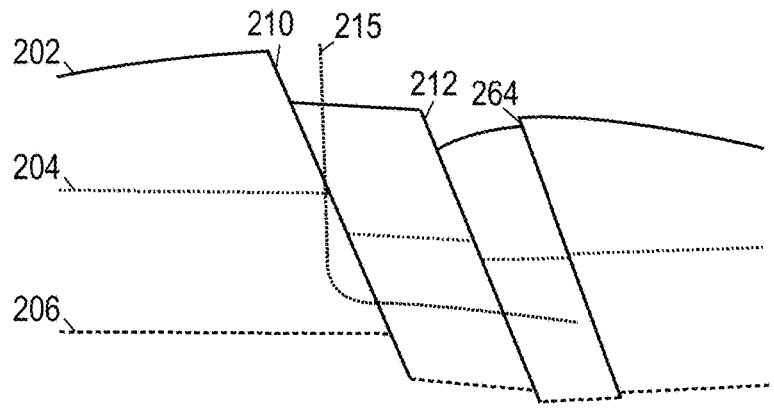
FIG. 6 is a second illustrative physical-space model representing an alternative structural interpretation.

We now turn to a potential re-use of design-space model information that may facilitate analysis in situations where the seismic image volume supports multiple structural interpretations. For example, the physical-space model of FIG. 2A may be but one of multiple possible interpretations derived from a given seismic image volume, and the physical-space model shown in FIG. 6 may represent a second possible interpretation, with a third primary fault 264 roughly parallel to the first two faults 210, 212, rather than an intersecting secondary fault 214 (FIG. 2A). Other potential structural interpretation differences may be associated with changes to fault/horizon locations and/or orientations and/or contact (e.g., due to alternative seismic velocity models or interpretation ambiguities). For example, the adjustment of fault/horizon contact can be achieved by modifying the unfaulting algorithm (an example of which is described in U.S. Patent Application Publication No. 2019/0302309 A1, the disclosure of which is incorporated herein by reference) to partial unfaulting instead of fully unfaulting. Further, the design-space model re-use scenarios can extend to different, but analogous, subsurface regions. It is contemplated that this approach may enable a design-space catalog of subsurface regions having different types for use with analogous subsurface regions (e.g., fluvial channels and deep-water turbidite systems).

Figure 7:
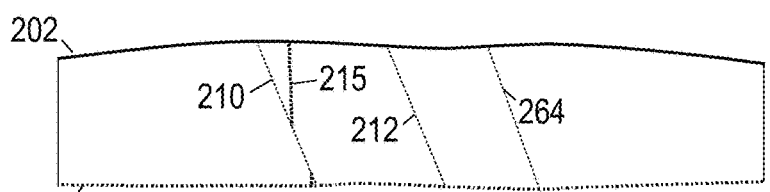
FIG. 7 is an illustrative partitioned design-space model for the alternative structural interpretation.
Figure 7:
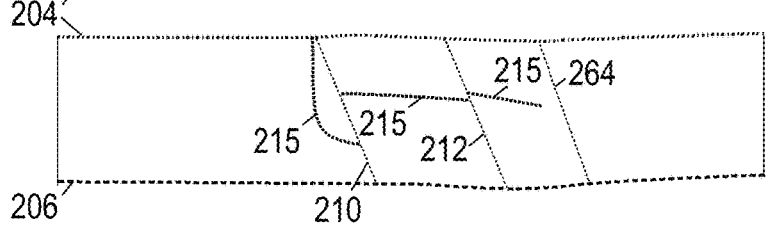

For a given subsurface region, such alternative interpretations regarding the presence or absence or locations and orientations of faults, horizons, or other structural features, are typically minor, differing from the original interpretation in relatively few areas where the seismic image volume exhibits structural ambiguity while maintaining a broad similarity throughout the rest of the model. Accordingly, there will almost certainly be a strong correlation between the design-space model for the alternative structural interpretation (shown in FIG. 7) and that for the original structural interpretation (shown in FIG. 2D), assuming the same zone divisions and design-space gridding parameters are employed.

Figure 8:
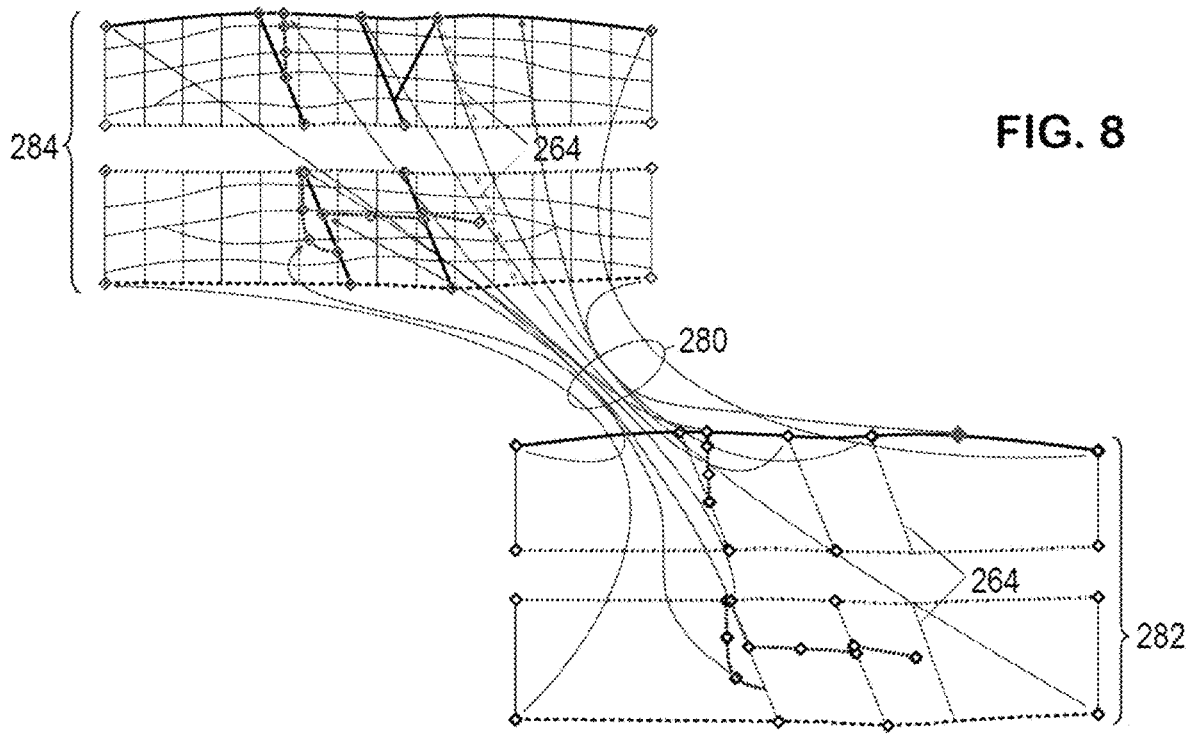
FIG. 8 is a mapping of an existing design-space model to the design-space model for the alternative structural interpretation.

To capitalize on this correlation, the process described in U.S. Pat. No. 10,107,938 is employed to determine the mapping from physical space to the design space in each zone. Various approaches can be used to determine the design-to-design space mapping. For example, corresponding features (e.g., points on corresponding faults, horizons, well paths) may be identified and used to determine a deformation map from one design space to the other. More specifically, corresponding points such as points marking the intersections between faults, horizons, and boreholes (see diamond markers in FIG. 8) may be identified in each design space. The design-to-design space mapping 280 is determined as a deformation of the marked points in design space 282 (for the alternative structural interpretation) to their counterparts in the design space 284 (for the original structural interpretation), preferably with smooth interpolations between the points. Such techniques are available in the open literature. For example, one may employ penalty methods in which if the differences between the corresponding points are penalized when computing the deformation map. Details of penalty methods can be found in classical computational text book, e.g. The Finite Element Method: Linear Static and Dynamic Finite Element Analysis (ISBN-13: 978-0486411811), the disclosure of which is incorporated herein by reference. Applying design-to-design space mapping, one can map the alternative structural interpretation (e.g., with the system of parallel faults including fault 264) into the original design space and reuse the property assignments and grid of the original design space. One can also skip design-to-design space mapping by inserting the operation of tying corresponding points in the unfaulting process, therefore, create original design space from the alternative physical space in one step.

The design space gridding process previously described with reference to FIG. 2C is performed to obtain a gridded multi-zone design space model 284 for the original structural interpretation. Before this design-space model 284 is partitioned (as described previously with reference to FIG. 2D), the set of faults from the alternative structural interpretation are mapped from either the alternative design-space model 282 (using the design-to-design space mapping 280) or from the physical space model (FIG. 6) using a composite mapping function that combines the physical-to-design space mapping with the design-to-design space mapping.

Once the set of faults from the alternative structural interpretation are mapped to the design space model 284, the design space mesh is partitioned as described previously. The partitioned design space mesh, with all the relevant petrophysical parameter values (or other material property values) from each mesh cell and/or cell surface, is reverse mapped to the physical space of the alternative structural interpretation to obtain the physical-space simulation grid for the alternative structural interpretation.

Figure 9:
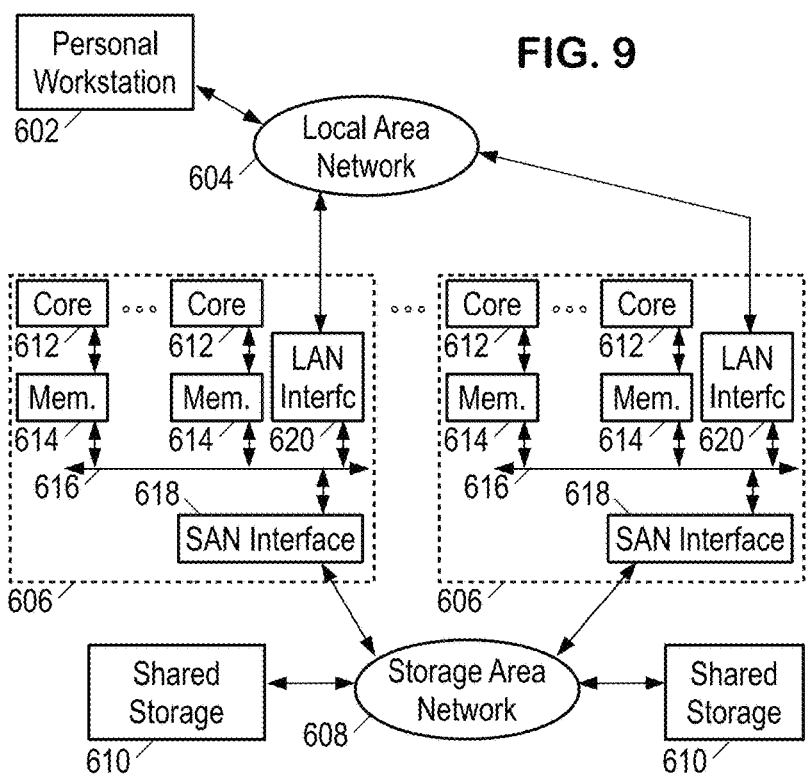
FIG. 9 is a block diagram of an illustrative subsurface modeling system.

FIG. 9 is a block diagram of an illustrative subsurface modeling system. The illustrative subsurface modeling system includes a personal workstation 602 coupled via a local area network (LAN) 604 to one or more multi-processor computers 606, which are in turn coupled via a storage area network (SAN) 608 to one or more shared storage units 610. Personal workstation 602 serves as a user interface to the subsurface modeling system, enabling a user to load data into the system, to configure and monitor the operation of the system, and to retrieve the results (often in the form of image data) from the system. Personal workstation 602 may take the form of a desktop computer with a display that graphically shows representations of the input and result data, and with a keyboard that enables the user to move files and execute processing software. LAN 604 provides high-speed communication between multi-processor computers 606 and with personal workstation 602. The LAN 604 may take the form of an Ethernet network.

Multi-processor computer(s) 606 provide parallel processing capability to enable suitably prompt processing of the input data to derive the results data. Each computer 606 includes multiple processors 612, distributed memory 614, an internal bus 616, a SAN interface 618, and a LAN interface 620. Each processor 612 operates on allocated tasks to solve a portion of the overall problem and contribute to at least a portion of the overall results. Associated with each processor 612 is a distributed memory module 614 that stores application software and a working data set for the processors' use. Internal bus 616 provides inter-processor communication and communication to the SAN or LAN networks via the corresponding interfaces 618, 620. Communication between processors in different computers 606 can be provided by LAN 604.

SAN 608 provides high-speed access to shared storage devices 610. The SAN 608 may take the form of, e.g., a Fibrechannel or Infiniband network. Shared storage units 610 may be large, stand-alone information storage units that employ magnetic disk media for nonvolatile data storage. To improve data access speed and reliability, the shared storage units 610 may be configured as a redundant disk array ("RAID").

The processors 612 cooperatively execute subsurface modeling software stored in the distributed memory and/or on the shared storage units, which configures the processors to retrieve measurement data and stored model information from the shared storage units 610, operate on the retrieved data and information to implement the modeling methods and improvements disclosed herein, and to store the resulting subsurface models on the shared storage units 610 for future use. Such future use includes visualization methods to convey model information to users, simulation of reservoir fluid movements, and evaluation of well placement and production strategies, enabling users to select sites for drillers to direct boreholes, complete wells, and produce reservoir fluids in an efficient manner.

FIG. 10 is a flow diagram of an illustrative subsurface modeling method. It begins in block 702 with the system obtaining seismic survey trace signal data pertaining to a region of interest. In block 704, the system migrates and/or inverts the seismic survey traces to derive at least a high-level picture of the subsurface structure, usually embodied as a volumetric property distribution model in the physical space. In block 706, the physical space model is examined to "interpret" the data, i.e., to identify horizons representing formation boundaries, faults, and any other discernable structures. While this interpretation can be automated to at least some degree, the industry typically employs a geologist or other professional to supervise the interpretation process and/or to perform the interpretation manually. Often, multiple structural interpretations may be found. In block 708, the system derives continuous-function based representations of the fault and horizon surfaces, extrapolating and truncating as needed to provide a watertight subsurface model.

In block 709, the system determines whether the original, or first, interpretation is being processed, and if so, blocks 710 to 730 are performed, including the loop of blocks 710 to 724 that represent zone-by-zone processing. Beginning with a first zone (e.g., the topmost or bottom-most zone) in block 710, the system analyzes the faulted formations and derives a real-to-design space mapping that heals the faults in that zone. In block 712, the mapping is applied to the real space model to obtain unfaulted horizons and geobodies in design space. The system may perform further guided or unguided analysis of the design space model to identify additional geobodies or horizons that were not evident in the real-space model, and to assign material or flow properties (e.g. porosity, permeability) to each geobody in the current zone. If a previous design-space model already exists for a different structural interpretation of this zone, a design-space to design-space mapping is preferably derived and used to transfer the property values from the existing model. In block 714, the system applies a gridding method to the design space model to derive in the current zone a design space mesh having cells with homogeneous (or otherwise well-defined) properties. In block 716, the system applies the real-to-design space mapping to the faults, determining the design-space location of these faults. The design space mesh cells intersected by the faults are partitioned or otherwise modified to align mesh cell boundaries with the fault surface. The system then applies the real-to-design space mapping in reverse to map this zone's modified mesh to obtain a simulation mesh for the corresponding zone of the real-space model in block 720. In block 722, the system determines whether all zones have been completed. If not, then in block 724 the system maps the node locations established for the fault interface of the current zone in real space to the corresponding interface of the next zone in design space. (The mapped node locations will be the initial nodes for the gridding process in block 714.) Control then returns to block 710.

Once the simulation grid has been established for all zones in real space, the system in block 726 determines the connection factors between cells within each zone, between cells across from each other on the zone interfaces, and between cells on opposite sides of each fault. In block 728, the system uses the connection factors to determine fluid transmissibilities between cells. In block 730, the system stores the model and physical space simulation mesh to disk or some other form of nontransient information storage medium. The system may also display or output the model and, optionally, provide an interactive visualization of the model to a user.

In block 731, the system determines whether alternative structural interpretations exist or are contemplated, and if so, the loop of blocks 706 to 709, 740 to 748 is repeated for each such alternative interpretation. Block 740 is similar to block 710, but the unfaulting and real-to-design space mapping is determined for all of the zones. In block 742, a mapping from the design space for the alternative structural interpretation to the original design space is derived. In block 744, the real-to-design space and design-to-design space mappings are used to map the faults of the alternative structural implementation into the original design space, where they are used to partition the mesh cells as described previously with reference to block 716. In block 746, the fault/side buffer regions, connection factors, and transmissibilities are updated to account for the differences in partitioning. In block 748, the resulting design space mesh is mapped back to the physical space to provide a simulation grid for the alternative structural interpretation. The loop may be repeated until a simulation mesh has been determine for each of the structural interpretations.

In block 732, the system configures one or more of the subsurface model(s) in accordance with an identified reservoir development strategy, e.g., by specifying well locations, completion zones, and production rates. In block 734 the system simulates production from the reservoir to evaluate the identified strategy. Blocks 732 and 734 may be repeated as needed to evaluate different strategies and refinements thereof relative to the various structural interpretations in an organized fashion designed to identify preferred strategies. In block 736 the system stores at least the results of each simulation, optionally displaying the results and offering an interactive visualization of the simulation and model to a user.

The above described approach to deriving multiple simulation grids based on one original design space model is expected to yield faster, more efficient evaluations of alternate structural interpretations.

Though the operations shown and described in the flow diagram are treated as being sequential for explanatory purposes, in practice the method may be carried out by multiple processors operating concurrently and perhaps even speculatively to enable out-of-order operations. The ordering and sequential treatment is not meant to be limiting. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

Embodiments of the present techniques also relate to an apparatus for performing the operations herein. This apparatus may be specially constructed (in a physical or virtual environment) for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.).

Furthermore, as will be apparent to one of ordinary skill in the relevant art, the modules, features, attributes, methodologies, and other aspects of the present disclosure can be implemented as software, hardware, firmware or any combination of the three. Of course, wherever a component of the present disclosure is implemented as software, the component can be implemented as a standalone program, as part of a larger program, as a plurality of separate programs, as a statically or dynamically linked library, as a kernel loadable module, as a device driver, and/or in any other way known to those of skill in the art of computer programming. The software, hardware, or firmware embodying the disclosed methods may implement machine-readable logic, such that a set of instructions or code residing in memory, when executed, causes one or more processors to employ the other components of a computer system as needed to perform the disclosed methods.

The following example embodiments of the invention are also disclosed.

Embodiment 1. A geologic modeling method that comprises: obtaining first and second physical space geologic models representing subsurface regions in physical space, the first and second physical space geologic models having different structural interpretations of one or more features; mapping each of the first and second physical space geologic models to associated first and second design space models each representing an unfaulted subsurface region, said mapping employing associated first and second physical-to-design space mappings; determining a design-to-design space mapping between the first design space model and the second design space model; gridding the first design space model to obtain a design space mesh with one or more associated properties for each cell; employing the first physical-to-design space mapping to map a first set of faults from the first physical space geologic model to the design space mesh; employing the second physical-to-design space mapping together with the design-to-design space mapping to map a second set of faults from the second physical space geologic model to the design space mesh; partitioning cells in the design space mesh along the first set of faults to obtain a first partitioned design space mesh with one or more associated properties for each cell; partitioning cells in the design space mesh along the second set of faults to obtain a second partitioned design space mesh with one or more associated properties for each cell; reverse mapping the first and second partitioned design space meshes and properties for each cell to physical space to obtain for the first and second physical space geologic models associated first and second physical space simulation meshes having one or more associated properties for each cell; and outputting the first and second physical space simulation meshes.

Embodiment 2. The method of Embodiment 1, wherein said outputting includes: storing the first and second physical space simulation meshes on a non-transitory information storage device; and displaying a visual representation of the geologic model with at least one of the first and second physical space simulation meshes.

Embodiment 3. The method of Embodiment 1 or 2, further comprising employing at least one of the first and second physical space simulation meshes to evaluate a well placement strategy or to evaluate a hydrocarbon volume.

Embodiment 4. The method of any one of Embodiments 1-3, wherein said design-to-design space mapping is a deformation to align corresponding features of the first and second design space models.

Embodiment 5. The method of Embodiment 4, wherein the corresponding features are points on horizons or faults.

Embodiment 6. The method of Embodiment 4, wherein the corresponding features are points on a well path.

Embodiment 7. The method of any one of Embodiments 1-6, wherein the first and second physical space geologic models represent different but stratigraphically analogous subsurface regions.

Embodiment 8. The method of any one of Embodiments 1-6, wherein the first and second physical space geologic models represent the same subsurface region and the different structural interpretations include one or more of different horizon positions and different arrangements of faults in the first and second geologic models.

Embodiment 9. The method of any one of Embodiments 1-8, wherein the first and second physical space geologic models represent the same subsurface and are generated by modifying a horizon discontinuity of at least one fault.

Embodiment 10. The method of Embodiment 9, wherein the modification is made by parameterizing the contacts of the fault and horizon on the two sides of the fault, and then adjusting a distance between at least one pair of corresponding points on the contact lines with the same parameterization value.

Embodiment 11. The method of Embodiment 10, wherein the distance can be adjusted uniformly by percentage.

Embodiment 12. The method of Embodiment 10, wherein the distance can be adjusted based on a function of the parameterization value.

Embodiment 13. A geologic modeling method that comprises: obtaining a physical space geologic model representing a subsurface region in physical space; mapping the physical space geologic model to a design space model which represents an unfaulted subsurface region; gridding the design space model to obtain a design space mesh with one or more associated properties for each cell; employing a physical-to-design space mapping to map a first set of faults from the physical space geologic model to the design space mesh; partitioning the cells in the design space mesh along the first set of faults to obtain a partitioned design space mesh with one or more associated properties for each cell; reverse mapping the partitioned design space mesh and properties for each cell to physical space to obtain a first physical space simulation mesh having one or more associated properties for each cell, wherein said mapping employs a first design-to-physical space mapping; mapping the partitioned design space mesh and properties for each cell to a second physical space to obtain a second physical space simulation mesh having one or more associated properties for each cell, wherein said mapping employs a second design-to-physical space mapping; and outputting the first and second physical space simulation meshes.

Embodiment 14. The method of Embodiment 13, wherein said outputting includes: storing the first and second physical space simulation meshes on a non-transitory information storage device; and displaying a visual representation of the geologic model with at least one of the first and second physical space simulation meshes.

Embodiment 15. The method of Embodiment 13 or 14, further comprising employing at least one of the first and second physical space simulation meshes to evaluate a well placement strategy or to evaluate a hydrocarbon volume.

Embodiment 16. The method of any one of Embodiments 13-15 wherein the first and second physical space simulation meshes represent different structural interpretations of the same subsurface region, wherein the different structural interpretations include one or more of different horizon positions and different arrangements of faults in the first and second geologic models.

Embodiment 17. A geologic modeling system that comprises: a memory having geologic modeling software; and one or more processors coupled to the memory to execute the geologic modeling software, the software causing the one or more processors to perform operations including: obtaining a first and second geologic models representing subsurface regions in physical space, the first and second geologic models having different structural interpretations of one or more features; mapping each of the first and second physical space geologic models to associated first and second design space models each representing an unfaulted subsurface region, said mapping employing associated first and second physical-to-design space mappings; determining a design-to-design space mapping from the second design space model to the first design space model; gridding the first design space model to obtain a design space mesh; employing the first physical-to-design space mapping to map a first set of faults from the first physical space geologic model to the design space mesh; employing the second physical-to-design space mapping together with the design-to-design space mapping to map a second set of faults from the second physical space geologic model to the design space mesh; partitioning cells in the design space mesh along the first set of faults to obtain a first partitioned design space mesh having one or more associated properties for each cell; partitioning cells in the design space mesh along the second set of faults to obtain a second partitioned design space mesh having one or more associated properties for each cell; reverse mapping the first and second partitioned design space meshes to physical space to obtain for the first and second geologic models an associated first and second physical space simulation meshes having one or more associated properties for each cell; and outputting the first and second physical space simulation meshes.

Embodiment 18. The system of Embodiment 17, wherein said outputting includes: storing the first and second physical space simulation mesh on a non-transitory information storage device; and displaying a visual representation of the geologic model with at least one of the first and second physical space simulation meshes.

Embodiment 19. The system of Embodiment 17 or 18, wherein the operations further include employing at least one of the first and second physical space simulation meshes to evaluate a well placement strategy.

Embodiment 20. The system of any one of Embodiments 17 to 19, wherein said design-to-design space mapping is a deformation to align corresponding features of the first and second design space models.

Embodiment 21. The system of any one of Embodiments 17 to 20, wherein the first and second geologic models represent different but analogous subsurface regions.

Embodiment 22. The system of any one of Embodiments 17 to 21, wherein the first and second geologic models represent the same subsurface region and the different structural interpretations include different arrangements of faults in the first and second geologic models.

Embodiment 23. The system of any one of Embodiments 17 to 22, wherein the first and second geologic models represent the same subsurface region and the different structural interpretations include different horizon positions in the first and second geologic models.

Embodiment 24. A non-transitory information storage product having computer readable program code embodied therein, which when executed configures a computer to implement a geologic modeling method that comprises: obtaining a first and second geologic models representing subsurface regions in physical space, the first and second geologic models having different structural interpretations of one or more features; mapping each of the first and second physical space geologic models to associated first and second design space models each representing an unfaulted subsurface region, said mapping employing associated first and second physical-to-design space mappings; determining a design-to-design space mapping between the first design space model and the second design space model; gridding the first design space model to obtain a design space mesh; employing the first physical-to-design space mapping to map a first set of faults from the first physical space geologic model to the design space mesh; employing the second physical-to-design space mapping together with the design-to-design space mapping to map a second set of faults from the second physical space geologic model to the design space mesh; partitioning cells in the design space mesh along the first set of faults to obtain a first partitioned design space mesh; partitioning cells in the design space mesh along the second set of faults to obtain a second partitioned design space mesh; reverse mapping the first and second partitioned design space meshes to physical space to obtain for the first and second geologic models an associated first and second physical space simulation meshes having one or more associated properties for each cell; and outputting the first and second physical space simulation meshes.

Embodiment 25. The non-transitory information storage product of claim 24, wherein said outputting includes: storing the first and second physical space simulation mesh on a non-transitory information storage device; and displaying a visual representation of the geologic model with at least one of the first and second physical space simulation meshes.

Embodiment 26. The non-transitory information storage product of Embodiment 24 or 25, wherein the method further comprises: employing at least one of the first and second physical space simulation meshes to evaluate a well placement strategy.

Embodiment 27. The non-transitory information storage product of any one of Embodiments 24-26, wherein said design-to-design space mapping is a smooth deformation to align corresponding features of the first and second design space models.

Embodiment 28. The non-transitory information storage product of any one of Embodiments 24-27, wherein the first and second geologic models represent the same subsurface region and the different structural interpretations include different horizon positions and different arrangements of faults in the first and second geologic models.

What is claimed is:

1. A geologic modeling method for extracting hydrocarbons, the method comprising:
obtaining first and second physical space geologic models representing subsurface regions in physical space, the first and second physical space geologic models having different structural interpretations of one or more features;

mapping each of the first and second physical space geologic models to associated first and second design space models each representing an unfaulted subsurface region, said mapping employing associated first and second physical-to-design space mappings;

determining a design-to-design space mapping between the first design space model and the second design space model;

gridding the first design space model to obtain a design space mesh with one or more associated properties for each cell;

employing the first physical-to-design space mapping to map a first set of faults from the first physical space geologic model to the design space mesh;

employing the second physical-to-design space mapping together with the design-to-design space mapping to map a second set of faults from the second physical space geologic model to the design space mesh;

partitioning cells in the design space mesh along the first set of faults to obtain a first partitioned design space mesh with one or more associated properties for each cell;

partitioning cells in the design space mesh along the second set of faults to obtain a second partitioned design space mesh with one or more associated properties for each cell;

reverse mapping the first and second partitioned design space meshes and properties for each cell to physical space to obtain for the first and second physical space geologic models associated first and second physical space simulation meshes having one or more associated properties for each cell; and outputting the first and second physical space simulation; and extracting hydrocarbons from a hydrocarbon-bearing formation using data from the first and second physical space simulation meshes.

2. The method of claim 1, wherein said outputting includes:
storing the first and second physical space simulation meshes on a non-transitory information storage device; and
displaying a visual representation of the geologic model with at least one of the first and second physical space simulation meshes.

3. The method of claim 1, further comprising employing at least one of the first and second physical space simulation meshes to evaluate a well placement strategy or to evaluate a hydrocarbon volume.

4. The method of claim 1, wherein said design-to-design space mapping is a deformation to align corresponding features of the first and second design space models.

5. The method of claim 4, wherein the corresponding features are points on horizons or faults.

6. The method of claim 4, wherein the corresponding features are points on a well path.

7. The method of claim 1, wherein the first and second physical space geologic models represent different but stratigraphically analogous subsurface regions.

8. The method of claim 1, wherein the first and second physical space geologic models represent the same subsurface region and the different structural interpretations include one or more of different horizon positions and different arrangements of faults in the first and second geologic models.

9. The method of claim 1, wherein the first and second physical space geologic models represent the same subsurface and are generated by modifying a horizon discontinuity of at least one fault.

10. The method of claim 9, wherein the modification is made by parameterizing the contacts of the fault and horizon on the two sides of the fault, and then adjusting a distance between at least one pair of corresponding points on the contact lines with the same parameterization value.

11. The method of claim 10, wherein the distance can be adjusted uniformly by percentage.

12. The method of claim 10, wherein the distance can be adjusted based on a function of the parameterization value.

13. A system comprising a processor and a memory, the processor in communication with the memory, the memory having stored thereon software instructions that, when executed by the processor, cause the processor to perform the method of claim 1.

14. A non-transitory computer readable medium having stored thereon software instructions that, when executed by a processor cause the processor to perform the method of claim 1.

15. A geologic modeling method for extracting hydrocarbons, the method comprising:
obtaining a physical space geologic model representing a subsurface region in physical space;
mapping the physical space geologic model to a design space model which represents an unfaulted subsurface region;
gridding the design space model to obtain a design space mesh with one or more associated properties for each cell;
employing a physical-to-design space mapping to map a first set of faults from the physical space geologic model to the design space mesh;
partitioning the cells in the design space mesh along the first set of faults to obtain a partitioned design space mesh with one or more associated properties for each cell;
reverse mapping the partitioned design space mesh and properties for each cell to physical space to obtain a first physical space simulation mesh having one or more associated properties for each cell, wherein said mapping employs a first design-to-physical space mapping;
mapping the partitioned design space mesh and properties for each cell to a second physical space to obtain a second physical space simulation mesh having one or more associated properties for each cell, wherein said mapping employs a second design-to-physical space mapping; and
outputting the first and second physical space simulation; and extracting hydrocarbons from a hydrocarbon-bearing formation using data from the first and second physical space simulation meshes.

16. The method of claim 15, wherein said outputting includes:
storing the first and second physical space simulation meshes on a non-transitory information storage device; and
displaying a visual representation of the geologic model with at least one of the first and second physical space simulation meshes.

17. The method of claim 15, further comprising employing at least one of the first and second physical space simulation meshes to evaluate a well placement strategy or to evaluate a hydrocarbon volume.

18. The method of claim 15, wherein the first and second physical space simulation meshes represent different structural interpretations of the same subsurface region, wherein the different structural interpretations include one or more of different horizon positions and different arrangements of faults in the first and second geologic models.

19. A system comprising a processor and a memory, the processor in communication with the memory, the memory having stored thereon software instructions that, when executed by the processor, cause the processor to perform the method of claim 15.

20. A non-transitory computer readable medium having stored thereon software instructions that, when executed by a processor cause the processor to perform the method of claim 15.

\* \* \* \* \*